(12) United States Patent
Yang et al.

(10) Patent No.: US 8,125,033 B2
(45) Date of Patent: Feb. 28, 2012

(54) POLYCRYSTALLINE SILICON LAYER, FLAT PANEL DISPLAY USING THE SAME, AND METHOD OF FABRICATING THE SAME

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 12 days.

(21) Appl. No.: 11/636,962

(22) Filed: Dec. 12, 2006

(65) Prior Publication Data
US 2007/0131934 A1   Jun. 14, 2007

(30) Foreign Application Priority Data
Dec. 13, 2005 (KR) ........................ 10-2005-0122628

(51) Int. Cl.
*H01L 21/20* (2006.01)

(52) U.S. Cl. ................ 257/368; 257/E21.133; 438/486; 438/795; 438/308

(58) Field of Classification Search ................ 438/486, 438/476, 308, 795; 257/E21.133, 368
See application file for complete search history.

(56) References Cited

U.S. PATENT DOCUMENTS

| | | | | |
|---|---|---|---|---|
| 5,498,573 A | * | 3/1996 | Whetten | 438/644 |
| 5,821,562 A | * | 10/1998 | Makita et al. | 257/64 |
| 5,851,860 A | * | 12/1998 | Makita et al. | 438/166 |
| 5,970,327 A | * | 10/1999 | Makita et al. | 438/166 |
| 6,162,667 A | * | 12/2000 | Funai et al. | 438/166 |
| 6,784,455 B2 | * | 8/2004 | Maekawa et al. | 257/66 |
| 7,071,083 B2 | * | 7/2006 | Lin | 438/487 |
| 2003/0001159 A1 | * | 1/2003 | Ohtani et al. | 257/64 |
| 2003/0211666 A1 | * | 11/2003 | Okumura | 438/151 |
| 2004/0235276 A1 | | 11/2004 | Lin | |
| 2005/0009262 A1 | * | 1/2005 | Takemura et al. | 438/202 |
| 2005/0072754 A1 | * | 4/2005 | Shih et al. | 216/23 |
| 2005/0142452 A1 | * | 6/2005 | You | 430/5 |
| 2005/0172888 A1 | * | 8/2005 | Gosain et al. | 117/87 |
| 2005/0255640 A1 | * | 11/2005 | Im et al. | 438/166 |

(Continued)

FOREIGN PATENT DOCUMENTS

JP          2000-031057          1/2000

(Continued)

OTHER PUBLICATIONS

Machine Translation of JP-2000-031057, to Makita et al., which was previously cited in Jan. 3, 2011 IDS.*

(Continued)

*Primary Examiner* — Kevin Parendo
(74) *Attorney, Agent, or Firm* — Robert E. Bushnell, Esq.

(57) ABSTRACT

A polycrystalline silicon layer, a flat panel display using the polycrystalline silicon layer, and a method of fabricating the same are provided. The polycrystalline silicon layer is formed by crystallizing a seed region of an amorphous silicon layer using a super grain silicon (SGS) crystallization technique. The crystallinity of the seed region spread into a crystallization region beyond the seed region. The crystallization region is formed into a semiconductor layer that can be incorporated to make a thin film transistor to drive flat panel displays. The semiconductor layer made by the method of the present invention provides uniform growth of grain boundaries, and characteristics of a thin film transistor made of the semiconductor layer are improved.

32 Claims, 12 Drawing Sheets

U.S. PATENT DOCUMENTS

2007/0134856 A1* 6/2007 Jang et al. .................. 438/149

FOREIGN PATENT DOCUMENTS

KR 1020030030403 A 7/2003

OTHER PUBLICATIONS

Office Action from the Chinese Patent Office issued in Applicant's corresponding Chinese Patent Application No. 200610166982.7 dated May 9, 2008.

Jinwook Seo, Super-Grain Silicon (SGS), Extended Abstracts; characterization of Super-Grain Silicon (SGS) Films, Extended Abstracts (The 65th Autumn Meeting, 2004); The Japan Society of Applied Physics No. 2. together with an English translation. (Japanese Office Action issued on Nov. 24, 2010 in the corresponding Japanese Patent application No. 2006-336334.).

Jung Chul Kim, et al., Single-Grain Thin-Film Transistor Using Ni-mediated Crystallization of Amorphous Silicon with a Silicon Nitride Cap Layer, Applied Physics Letters, Dec. 15, 2003. vol. 83 pp. 5068-5070. (Japanese Office Action issued on Nov. 24, 2010 in the corresponding Japanese Patent application No. 2006-336334.).

European Search Report issued on Dec. 14, 2010 in the corresponding European Patent Application No. 06256355.6.

* cited by examiner

POLYCRYSTALLINE SILICON LAYER, FLAT PANEL DISPLAY USING THE SAME, AND METHOD OF FABRICATING THE SAME

CLAIM OF PRIORITY

This application makes reference to, incorporates the same herein, and claims all benefits accruing under 35 U.S.C. §119 from an application for POLYCRYSTALLINE SILICON LAYER, FLAT PANEL DISPLAY USING THE POLYCRYSTALLINE SILICON LAYER AND METHOD FOR FABRICATING THE SAME earlier filled in the Korean Intellectual Property Office on 13 Dec. 2005 and there duly assigned Serial No. 10-2005-0122628.

BACKGROUND OF THE INVENTION

1. Field of the Invention

The present invention relates to a polycrystalline silicon layer, a flat panel display using the same, and a method of fabricating the same, and more particularly, to a polycrystalline silicon layer, a flat panel display using the same, and a method of fabricating the same in which a predetermined region of an amorphous silicon layer is crystallized by a super grain silicon (SGS) crystallization technique, crystallinity of a seed region is spread to become a crystallization layer, and then the crystallization layer is formed as a semiconductor layer. The resulting polycrystalline silicon layer has excellent characteristics and uniformity.

2. Description of the Related Art

A thin film transistor used in a flat panel display, such as an organic electro luminescence device, is made by depositing an amorphous silicon layer on a transparent substrate such as a glass, quartz or plastic substrate, dehydrogenating the amorphous silicon layer, ion-implanting impurities for forming a channel, crystallizing the amorphous silicon layer to form a polycrystalline silicon layer, and then patterning the polycrystalline silicon layer to fabricate a semiconductor layer.

Methods of crystallizing the amorphous silicon layer into a polycrystalline silicon layer include solid phase crystallization (SPC), excimer laser crystallization (ELC), metal induced crystallization (MIC), and metal induced lateral crystallization (MILC). SPC is a method of annealing an amorphous silicon layer for several to several tens of hours at a temperature of about 700° C. or less, which is a transition temperature of glass used as a substrate of a display device employing a thin film transistor. ELC is a method of crystallizing a silicon layer by irradiating the silicon layer with an excimer laser and locally heating the silicon layer to a high temperature for very short time, and MIC is a method of using phase transfer induction from amorphous silicon to polysilicon by contacting the amorphous silicon layer with metals such as nickel (Ni), palladium (Pd), gold (Au), and aluminum (Al), or implanting such metals into the amorphous silicon layer. MILC involves a technique of inducing sequential crystallization of silicon by lateral diffusion of silicide formed by reacting metal with the silicon.

However, when thin film transistors are made of the polycrystalline silicon layers crystallized by these methods, the thin film transistors have non-uniform characteristics such as non-uniform threshold voltage and off-characteristics due to non-uniform grain size and irregular distribution of grain boundaries.

SUMMARY OF THE INVENTION

The present invention provides a polycrystalline silicon layer with superior characteristics obtained by crystallizing a seed region through a super grain silicon (SGS) technique, and by spreading the crystallinity of the seed region to a crystallization region where the thin film transistor will be formed. A semiconductor layer fabricated by the method of the present invention has a uniform grain size and a regular distribution of grain boundaries. The present invention also provides a flat panel display incorporated using the polycrystalline silicon layer.

One aspect of the invention provides a polycrystalline silicon layer, including a substrate, a seed region formed on the substrate, and a crystallization region grown by the seed region and formed on the substrate. The seed region has at least 3.5 micro-meters in width.

Another aspect of the invention provides a method of fabricating a polycrystalline silicon layer including steps of forming an amorphous silicon layer on a substrate, forming a first pattern layer on the amorphous silicon layer where the first pattern layer has an opening through which a portion of the amorphous silicon layer is exposed, forming a second pattern layer on the first pattern layer and on the exposed portion of the amorphous silicon layer, forming a metal catalyst layer on the second pattern layer, crystallizing a region of the amorphous silicon layer to form a seed region in the amorphous silicon layer where the seed region has a width of at least 3.5 micro-meters and is formed within the exposed portion of the amorphous silicon layer; and spreading crystallinity of the seed region beyond the exposed portion of the amorphous silicon layer.

Still another aspect of the invention provides a method of fabricating a polycrystalline silicon layer including steps of forming an amorphous silicon layer on a substrate, forming a second pattern layer on the amorphous silicon layer, forming a first pattern layer on the second pattern layer where the first pattern layer having an opening through which a portion of the second pattern layer is exposed, forming a metal catalyst layer on the first pattern layer and on the exposed portion of the second pattern layer, crystallizing a region of the amorphous silicon layer to form a seed region in the amorphous silicon layer where the seed region has a width of at least 3.5 micro-meters and the seed region is formed under the exposed portion of the second pattern layer, and spreading crystallinity of the seed region beyond the seed region of the amorphous silicon layer.

Yet another aspect of the invention provides a flat panel display including a substrate, a semiconductor layer whose one side is either parallel to or perpendicular to a major direction of grain boundaries of a crystallization region grown from a seed region having at least 3.5 micro-miters in width, the semiconductor layer being arranged on the substrate and formed by patterning the crystallization region, a gate insulating layer disposed on the semiconductor layer, a gate electrode disposed on the gate insulating layer, an interlayer insulating layer disposed on the gate electrode, a source electrode and a drain electrode contacting the semiconductor layer, and disposed on the interlayer insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components wherein.

DETAILED DESCRIPTION OF THE INVENTION

Figure 1A:
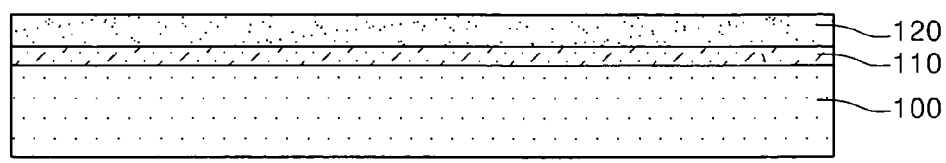
FIGS. 1A to 1F are cross-sectional views illustrating a method of forming a polycrystalline silicon layer presented as an exemplary embodiment of the invention.

The present invention will now be described more completely hereinafter with reference to the accompanying drawings, in which exemplary embodiments of the invention are shown. These embodiments are provided to make this disclosure thorough and complete. In the drawings, the thickness and length of layers and regions may be exaggerated for clarity. Like elements are denoted by like reference numerals throughout the drawings.

FIGS. 1A to 1F are cross-sectional views illustrating a method of forming a polycrystalline silicon layer presented as an exemplary embodiment of the invention. Referring to FIG. 1A, buffer layer 110 is formed on transparent insulating substrate 100 such as glass or plastic substrate. Here, buffer layer 110 serves to inhibit moisture or impurities generated on the substrate from diffusing into a device that is to be formed on buffer layer 110, and to regulate a heat transmission rate during crystallization, thereby enabling a semiconductor layer to be smoothly crystallized. Amorphous silicon layer 120 is formed on buffer layer 110 using physical vapor deposition (PVD) or chemical vapor deposition (CVD).

Figure 1B:
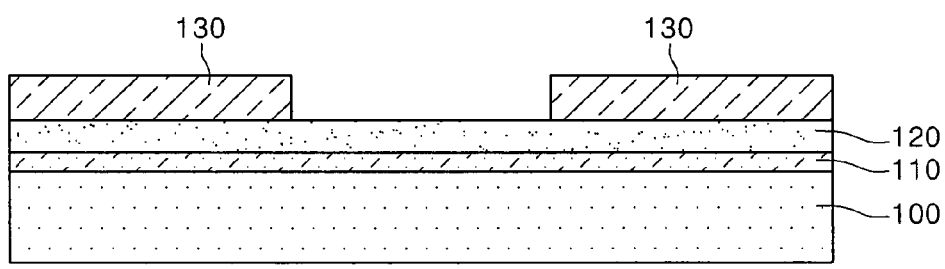

Referring to FIG. 1B, first pattern layer 130 having a silicon oxide layer, which is not able to diffuse a metal catalyst, is formed on amorphous silicon layer 120. Here, first pattern layer 130 has at least one opening to expose a predetermined region of amorphous silicon layer 120. First pattern layer 130 can be formed to a thickness of about 50 Å to about 5,000 Å.

Figure 1C:
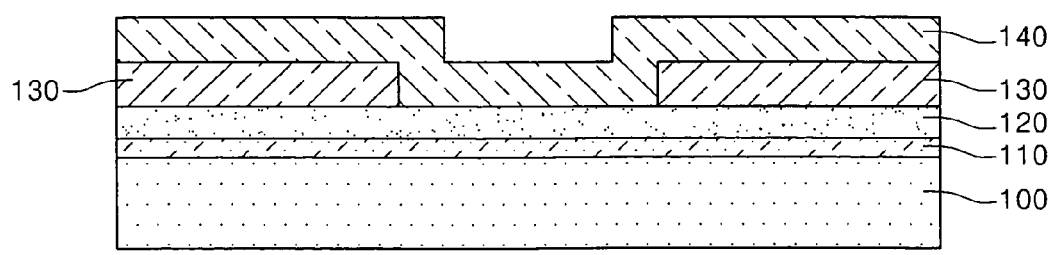

Referring to FIG. 1C, second pattern layer 140 is formed on the entire surface of the substrate covering first pattern layer 130 and exposed region of amorphous silicon layer 120. Here, second pattern layer 140 includes a silicon nitride layer to enable diffusion of the metal catalyst, and may have a thickness of about 50 Å to about 5,000 Å. Moreover, second pattern layer 140 should be formed to entirely cover the region of amorphous silicon layer 120 exposed by first pattern layer 130.

Figure 1D:
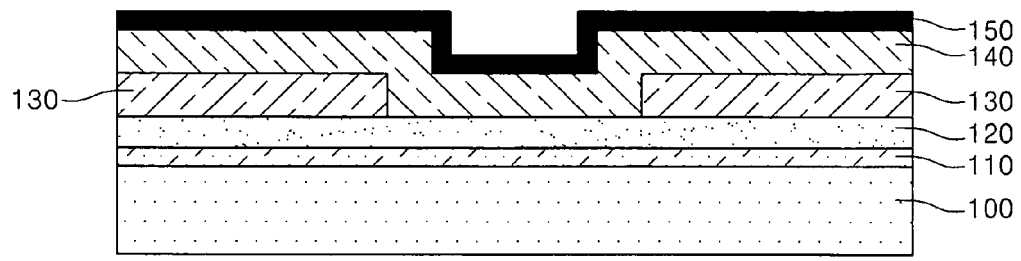

Referring to FIG. 1D, metal catalyst layer 150 is formed on second pattern layer 140. Here, metal catalyst layer 150 is made of one of nickel (Ni), palladium (Pd), titanium (Ti), silver (Ag), gold (Au), aluminum (Al), tin (Sn), antimony (Sb), copper (Cu), cobalt (Co), molybdenum (Mo), chromium (Cr), ruthenium (Ru), rhodium (Rh), cadmium (Cd), and platinum (Pt).

Metal catalyst layer 150 may be formed at a concentration of $10^{11}$ to $10^{15}$ atoms/cm$^2$. The extent of the crystallization of amorphous silicon layer 120 varies depending on the concentration of metal catalyst layer 150. For example, when metal catalyst layer 150 is formed to have a very high concentration, a grain size of a polycrystalline silicon layer not only becomes finer, but an amount of a metal catalyst left on the polycrystalline silicon layer also increases. Therefore, characteristics of the polycrystalline silicon layer deteriorate. On the other hand, when metal catalyst layer 150 is formed to have a very low concentration, it is difficult to deposit the layer evenly with a deposition apparatus, and a seed is not sufficiently formed to crystallize amorphous silicon layer 120.

Figure 1E:
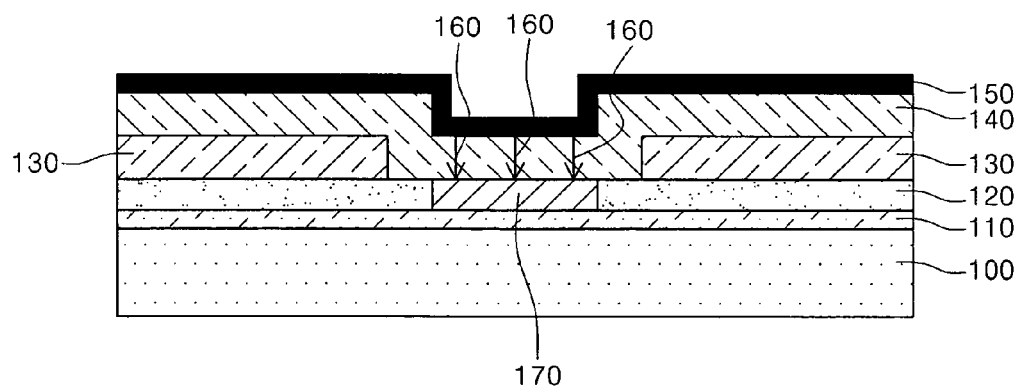

Referring to FIG. 1E, the metal catalyst in metal catalyst layer 150 is diffused into a predetermined region of amorphous silicon layer 120 by heat-treating the substrate that includes amorphous silicon layer 120, first pattern layer 130, second pattern layer 140, and metal catalyst layer 150. A seed (not illustrated) is formed by the diffused metal catalyst, so that the predetermined region of amorphous silicon layer 120 is crystallized into a seed region 170.

The formation of seed region 170 is affected by diffusion of metal catalyst 160. In order to form the seed region, the metal catalyst is easily diffused into second pattern layer 140, but is not diffused into first pattern layer 130.

The metal catalyst in metal catalyst layer 150 is diffused into amorphous silicon layer 120 by heat-treating the substrate, so that the seed is formed. Accordingly, the metal catalyst remains in seed region 170 after crystallization, and has a concentration of $1 \times 10^{13}$ atoms/cm$^2$ or less.

Seed region 170 is a polycrystalline silicon layer crystallized by the super grain silicon (SGS) crystallization technique. Here, the SGS crystallization technique includes the steps of sequentially stacking the amorphous silicon layer and the second pattern layer enabling diffusion of the metal catalyst from the metal catalyst layer on the substrate, diffusing the metal catalyst into the amorphous silicon layer through the second pattern layer by heat-treating the substrate, forming a seed, and crystallizing the amorphous silicon layer by the seed.

Grains of the polycrystalline silicon layer of seed region 170 radially grow around the seeds forming a slightly irregular circular shape, and thereby each grain boundary also has a slightly irregular circular shape. The plurality of grains are formed in seed region 170, but positions and the number of the seeds are not regulated. As a result, growth directions of crystals are random in seed region 170, and thereby directions of grain boundaries are random in seed region 170 as well.

Figure 1F:
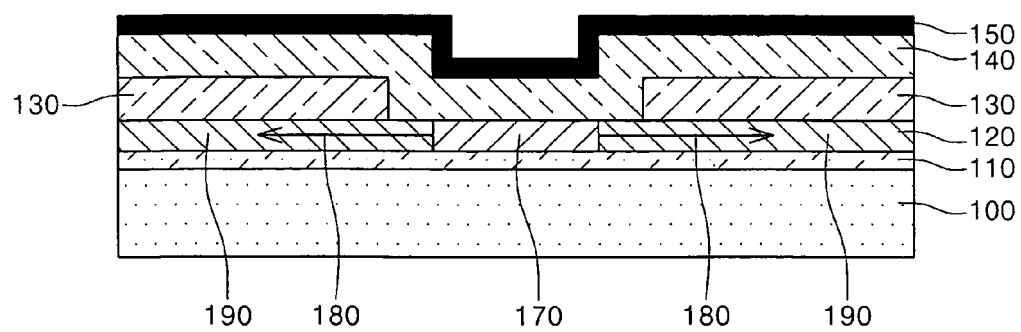

Referring to FIG. 1F, portion of amorphous silicon layer 120 that is located under first pattern layer 130 is formed into crystallization region 190 by spreading the crystallinity of seed region 170 into crystallization region 190. In other words, the crystallinity of seed region 170 spreads beyond seed region 170. Crystallization region 190 is directly affected by seed region 170. That is, crystallization region 190 is grown by the spread of the crystallinity of seed region 170, and therefore a crystalline size and a crystallization direction of crystallization region 190 is affected by the crystalline size and the crystallization direction of seed region 170. However, the seed is not formed in crystallization region 190, unlike in seed region 170, so that the metal catalyst hardly exists there.

Grain boundaries of crystallization region 190 are formed along crystal growth direction 180 of crystallization region 190 as a major direction. That is, the major direction of the grain boundaries is perpendicular to the longitudinal direction of seed region 170. Crystallization of seed region 170 and crystallization region 190 is performed at a temperature of about 400° C. to 800° C. for 1 minute to 3,000 minutes.

Figure 2A:
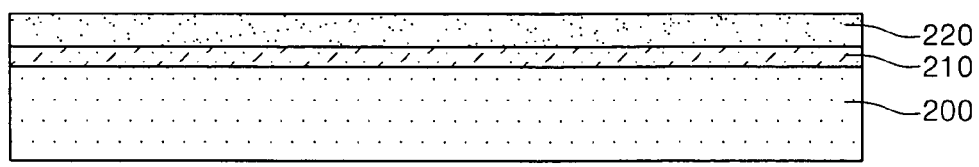
FIGS. 2A to 2F are cross-sectional views illustrating a method of forming a polycrystalline silicon layer presented as another exemplary embodiment of the invention.

FIGS. 2A to 2F are cross-sectional views illustrating a method of forming a polycrystalline silicon layer presented as another exemplary embodiment of the invention. Referring to FIG. 2A, buffer layer 210 is formed on transparent insulating substrate 200 such as glass or plastic. Buffer layer 210 inhibits moisture or impurities generated on the substrate from diffusing into a device to be formed on buffer layer 210, or enable a semiconductor layer to be well crystallized by regulating a heat transmission rate during crystallization. Amorphous silicon layer 220 is formed on buffer layer 210 by using PVD or CVD.

Figure 2B:
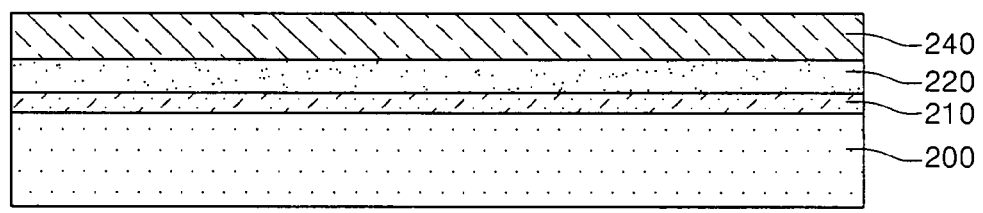

Referring to FIG. 2B, second pattern layer 240 is formed to enable diffusion of a metal catalyst into amorphous silicon layer 220. Second pattern layer 240 includes a silicon nitride layer, and may have a thickness of about 50 Å to 5,000 Å.

Figure 2C:
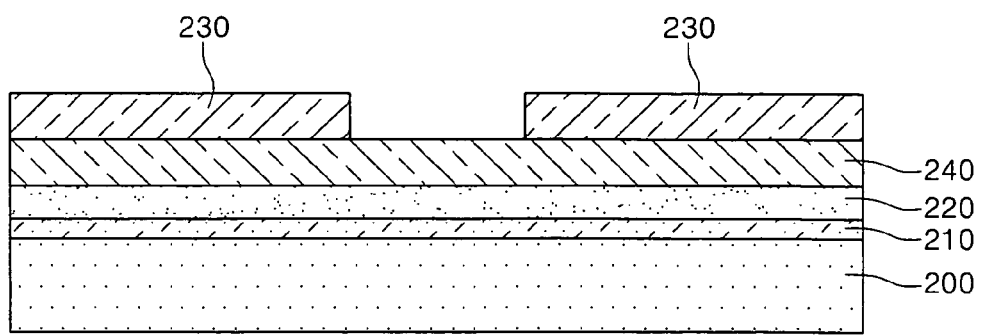

Referring to FIG. 2C, first pattern layer 230 is formed on second pattern layer 240. First pattern layer 230 has at least one opening to expose a predetermined region of second pattern layer 240. First pattern layer 230 includes a silicon oxide layer which does not diffuse a metal catalyst, and can have a thickness of about 50 Å to 5,000 Å.

Figure 2D:
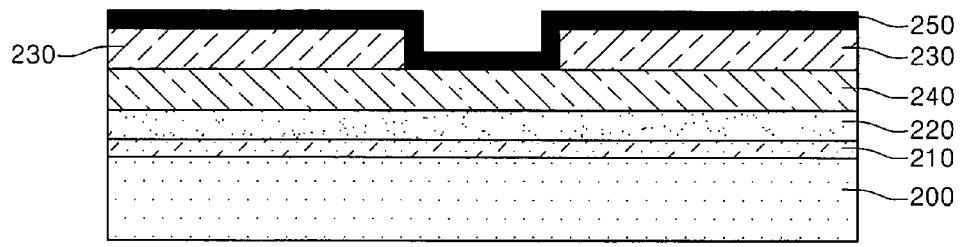

Referring to FIG. 2D, metal catalyst layer 250 is formed on the upper surfaces of first pattern layer 230 and the exposed region of second pattern layer 240. Metal catalyst layer 250 is formed of at least one of nickel (Ni), palladium (Pd), titanium (Ti), silver (Ag), gold (Au), aluminum (Al), tin (Sn), antimony (Sb), copper (Cu), cobalt (Co), molybdenum (Mo), chromium (Cr), ruthenium (Ru), rhodium (Rh), cadmium (Cd), and platinum (Pt).

Metal catalyst 250 can be formed to have a concentration of $10^{11}$ to $10^{15}$ atoms/cm$^2$. The extent of crystallization of amorphous silicon layer 220 varies depending on the concentration of metal catalyst layer 250. For example, when metal catalyst layer 250 is formed to have a very high concentration, a grain size of a polycrystalline silicon layer not only becomes finer, but an amount of a metal catalyst left on the polycrystalline silicon layer also increases, so that characteristics of the polycrystalline silicon layer deteriorate. When metal catalyst layer 250 is formed to have a very low concentration, it is difficult to deposit the layer evenly by the use of a deposition apparatus, and a seed is not sufficiently formed to crystallize amorphous silicon layer 220.

Figure 2E:
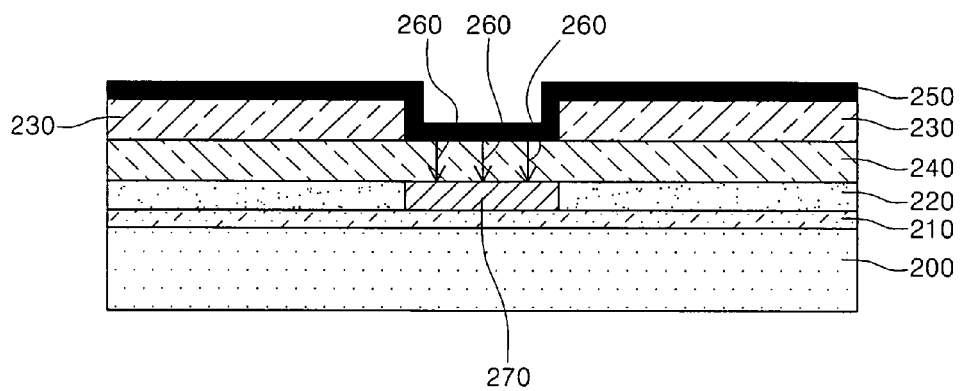

Referring to FIG. 2E, metal catalyst 260 in metal crystal layer 250 diffuses into a predetermined region of amorphous silicon layer 220 by heat-treating the substrate that includes amorphous silicon layer 220, first pattern layer 230, second pattern layer 240, the metal catalyst layer 250. The diffused metal catalyst forms a seed (not illustrated), and a predetermined region of amorphous silicon layer 220 is crystallized into seed region 270 by the seed.

The formation of seed region 270 is affected by diffusion of the metal catalyst. Metal catalyst 260 diffuses easily into second pattern layer 240, but does not diffuse into first pattern layer 230, and thereby the seed region can be formed under the exposed region of second pattern layer 240. That is, a metal catalyst of metal catalyst layer 250, which is formed on first pattern layer 230, is not diffused, while the metal catalyst deposited on second pattern layer 240 easily diffuses to reach amorphous silicon layer 220.

Grains of a polycrystalline silicon layer of seed region 270 radially grow around seeds forming a slightly irregular circular shape, and thereby each grain boundary has also a slightly irregular circular shape. A plurality of grains is formed in seed region 270, but position and the number of the seeds are not regulated. As a result, crystal growth directions are random in seed region 270, and thereby directions of grain boundaries are random in seed region 270 as well.

Figure 2F:
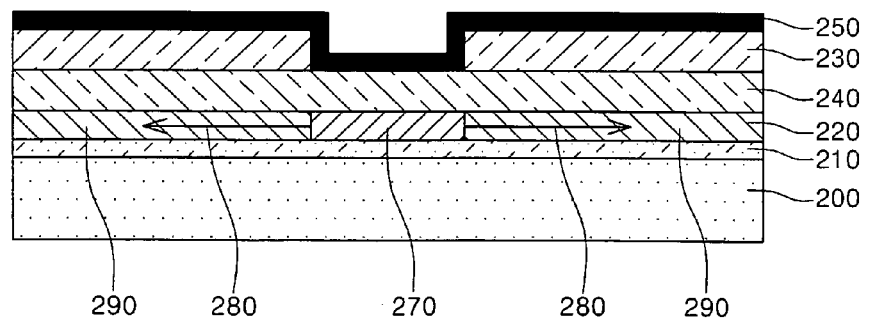

Referring to FIG. 2F, a portion of amorphous silicon layer 220 under first pattern layer 230 is formed into crystallization region 290 by spread of the crystallinity of seed region 270. Crystallization region 290 is directly affected by seed region 270. That is, since crystallization region 290 is crystallized by the spread of crystallinity of seed region 270, crystalline size and the direction of the crystallization of crystallization region 290 is affected by the crystalline size and the direction of the crystallization of the seed region 270. However, the seed is not formed in crystallization region 290, unlike in seed region 270, so that the metal catalyst hardly exists there.

Grain boundaries of crystallization region 290 are formed along the crystal growth direction 280 of crystallization region 290. That is, the major direction of the grain boundaries is perpendicular to the longitudinal direction of seed region 270. Crystallization of seed region 270 and crystallization region 290 is performed at a temperature of about 400° C. to 800° C. for 1 minutes to 3,000 minutes.

Figure 3A:
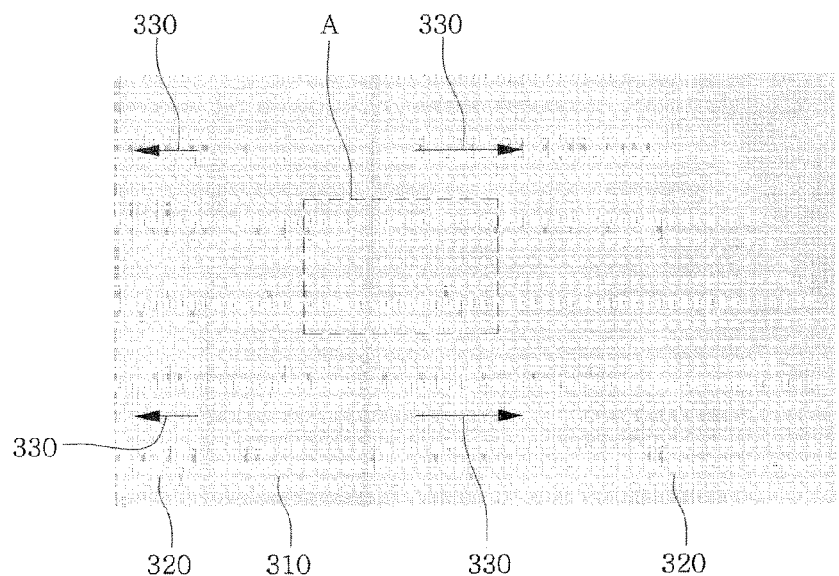
FIGS. 3A and 3B are plan views showing a polycrystalline silicon layer crystallized according to the method presented as another exemplary embodiment of the present invention.
Figure 3B:
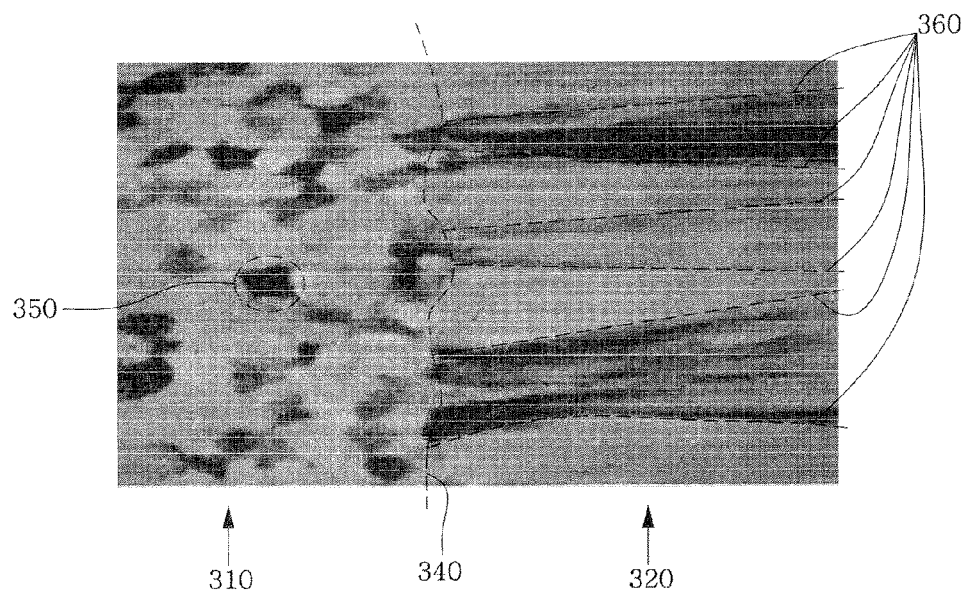

FIGS. 3A and 3B are plan views of a polycrystalline silicon layer crystallized according to the method of the present invention. Referring to FIG. 3A, an amorphous silicon layer is crystallized into a polycrystalline silicon layer by the method described above with reference to FIGS. 1A to 1F or 2A to 2F. When a metal catalyst layer, a first pattern layer, and a second pattern layer are removed, seed region 310 and crystallization region 320 are shown in FIGS. 3A and 3B. Seed region 310 is crystallized by the SGS crystallization technique, and crystallization region 320 is formed by causing the crystallinity of seed region 310 to spread.

FIG. 3B, which enlarges region A of FIG. 3A, is divided into seed region 310 crystallized by the SGS crystallization technique, crystallization region 320 formed by the growth of crystals from seed region 310 and their interface 340. A plurality of polygonal (similar to a circular shape) grains 350 exist in seed region 310, and grain boundaries 360 are formed along a direction approximately perpendicular to the stretched direction of interface 340 in crystallization region 320. The stretched direction of interface 340 is defined as a longitudinal direction of the seed region. The direction of grain boundaries inside seed region 310 is random, while the major direction of grain boundaries in crystallization region 320 is regular and is approximately perpendicular to the stretched direction of interface 340.

Figure 4A:
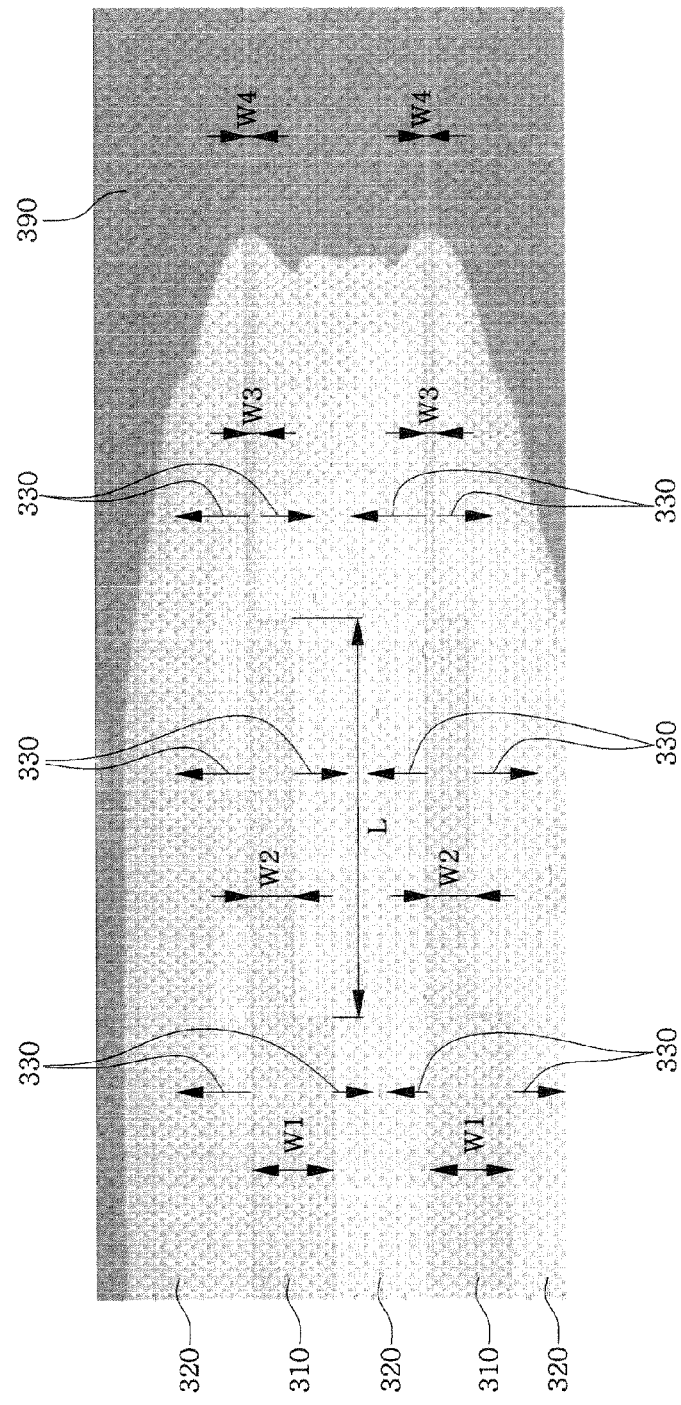
FIGS. 4A and 4B are a photograph and a graph which show a relationship between a width of a seed region and a growth length of a crystallization region according to another exemplary embodiment of the invention.
Figure 4B:
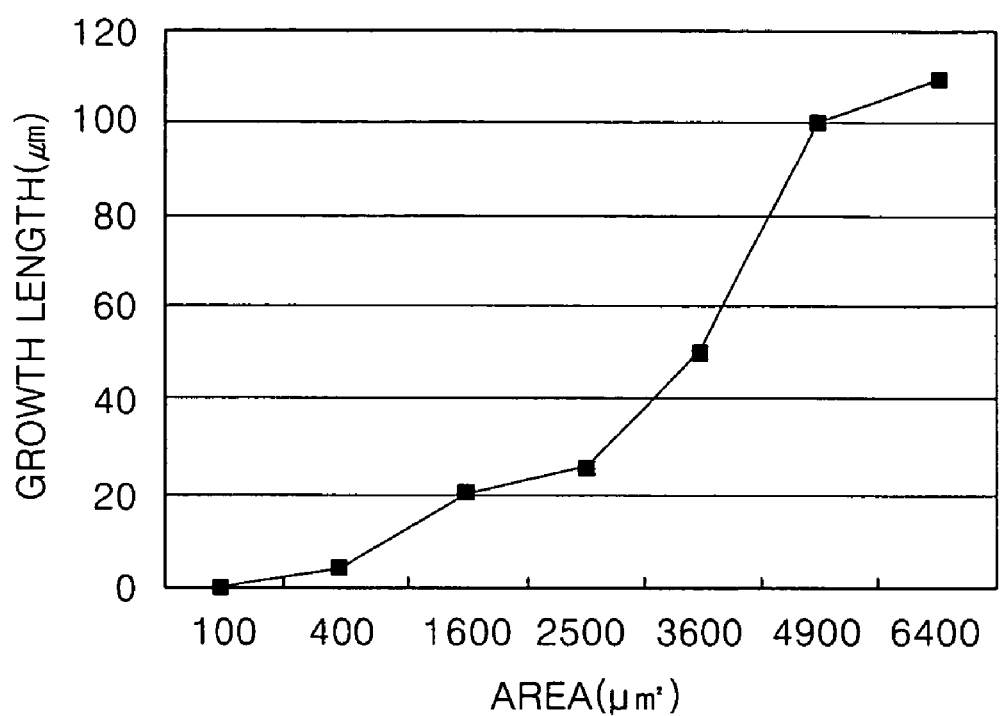

FIG. 4A is a photograph showing seed regions 310 and crystallization regions 320, and FIG. 4B is a graph showing a relationship between an area of a seed region and growth length of a crystallization region according to the invention. Referring to FIGS. 4A and 4B, it is shown that the growth length of the crystallization region depends on the width of the seed region at a given length of the seed region. Herein width of a seed region is defined as a distance of the seed region along a direction perpendicular to a longitudinal (or stretched) direction of the seed region, as marked as W1-W4 in FIG. 4A. Length of a seed region is defined as a distance along the longitudinal direction of the seed region.

In order to obtain the relationship between an area of a seed region and growth length of a crystallization region, lengths L of seed regions 310 is set to be 450 μm. As shown in FIG. 4A, width of the seed region varies depending on a location along the length L. If width W1 of seed region 310 is 100 μm, the growth length of crystallization region 330 is 100 μm or more, and if width W2 of seed region 310 is 50 μm, the growth length of crystallization region 330 is 100 μm or more. In other words, whenever width W1 and W2 of seed region 310 are more than 50 μm, the growth lengths of crystallization region are 100 μm or more. Thus, the crystallization region is almost saturated.

If width W3 of seed region 310 is 10 μm, growth length 330 of crystallization region 320 is about 80 μm. The growth length of the crystallization region of the 10 μm-wide seed region, however, increases around the region closer to the 50 μm-wide seed region. This is because the growth length of the crystallization region of the 10 µm-wide seed region is affected by the 50 µm-wide seed region.

In the view of the result shown in FIG. 4A, only when seed region 310 is at least 10 µm wide, growth starts so as to form crystallization region 330. Accordingly, it can be understood that if the seed region is 2 µm wide or less, growth does not start and crystallization region 330 is not formed. However, it cannot be seen from the result of FIG. 4A alone whether growth starts or not in the case that seed region 310 is between about 2 µm and 10 µm wide.

Referring to FIG. 4B, roughly rectangle seed regions having a predetermined area were formed, and growth lengths of the crystallization region were measured in order to observe whether growth starts so as to form the crystallization region when the width of seed region 310 was between about 2 µm and 10 µm. Because it is difficult to make a seed region 450 µm long and several µm wide, the strategy was to observe whether growth is possible by forming square seed regions which have equal length and width. Another reason for forming the square seed regions is that it becomes more difficult to form first pattern layer 130, second pattern layer 140, and metal catalyst layer 150, described in FIGS. 1D to 1F and 2D to 2F, and to diffuse a metal catalyst from the metal catalyst layer, as the width of the seed region becomes narrower. When a rectangular seed region has substantially the same length and width by patterning the first pattern layer or the second pattern layer into a predetermined shape, a metal catalyst is easily diffused. This is because a metal catalyst is more easily diffused through a diffusion path with similar width and length than through a narrow width and large length.

Referring to FIG. 4B, when the rectangular seed region has an area of 6400 µm² (if the rectangular seed region is calculated in terms of a length of 450 µm, its width is about 14 µm), a growth length of a crystallization region is about 110 µm, and when the area of the seed region is 4,900 µm² (if the length of the rectangular seed region is calculated in terms of 450 µm, its width is about 11 µm), the growth length of the crystallization region is about 100 µm. In addition, when the areas of the seed region are 3600 µm², 2500 µm², 1600 µm², 400 µm², and 100 µm², the widths corresponds to 8 µm, 5.5 µm, 3.5 µm, 0.8 µm, and 0.2 µm, respectively, and the growth lengths of the crystallization region are about 50 µm, 25 µm, 20 µm, 5 µm, and 0 µm, respectively as shown in the graph of FIG. 4B.

Compared the results of FIG. 4A with the results of FIG. 4B, it can be shown that the case of having an area of 4900 µm² in FIG. 4B is similar to the case of having a width of 10 µm in FIG. 4A, but the growth lengths are 100 µm and 80 µm, respectively. In other words, the growth length obtained from a seed region with roughly the same length and width is slightly different from the growth length obtained from a seed region which has a greater length and a narrow width even though the areas of the seed regions are approximately the same.

Thus, considering that the growth length is longer in the seed region with roughly the same length and width, when the seed regions having areas of 3600 µm², 2500 µm², 1600 µm², 400 µm², and 100 µm² are substituted with the seed region having widths of 8 µm, 5.5 µm, 3.5 µm, 0.8 µm, and 0.2 µm and a length of 450 µm, the possibility of growth can be known, but the exact growth length of the seed region having a length of 450 µm cannot be known. Therefore, if a seed region with roughly the same length and width has an area of 1600 µm², the growth length is 20 µm. Considering the longer growth length in a rough square seed region, it can be known that growth is possible when a width is 3.5 µm. Meanwhile, if a rectangle with roughly the same length and width has an area of 400 µm², the growth length is 5 µm, and thus it can be concluded that crystallization hardly occurs when a width is 0.8 µm. As a result, if the seed region is not nearly square, but a rectangle has a big difference between the length and the width (the length of the rectangle is 450 µm), growth is possible when the seed region has a width of at least 3.5 µm.

Figure 5:
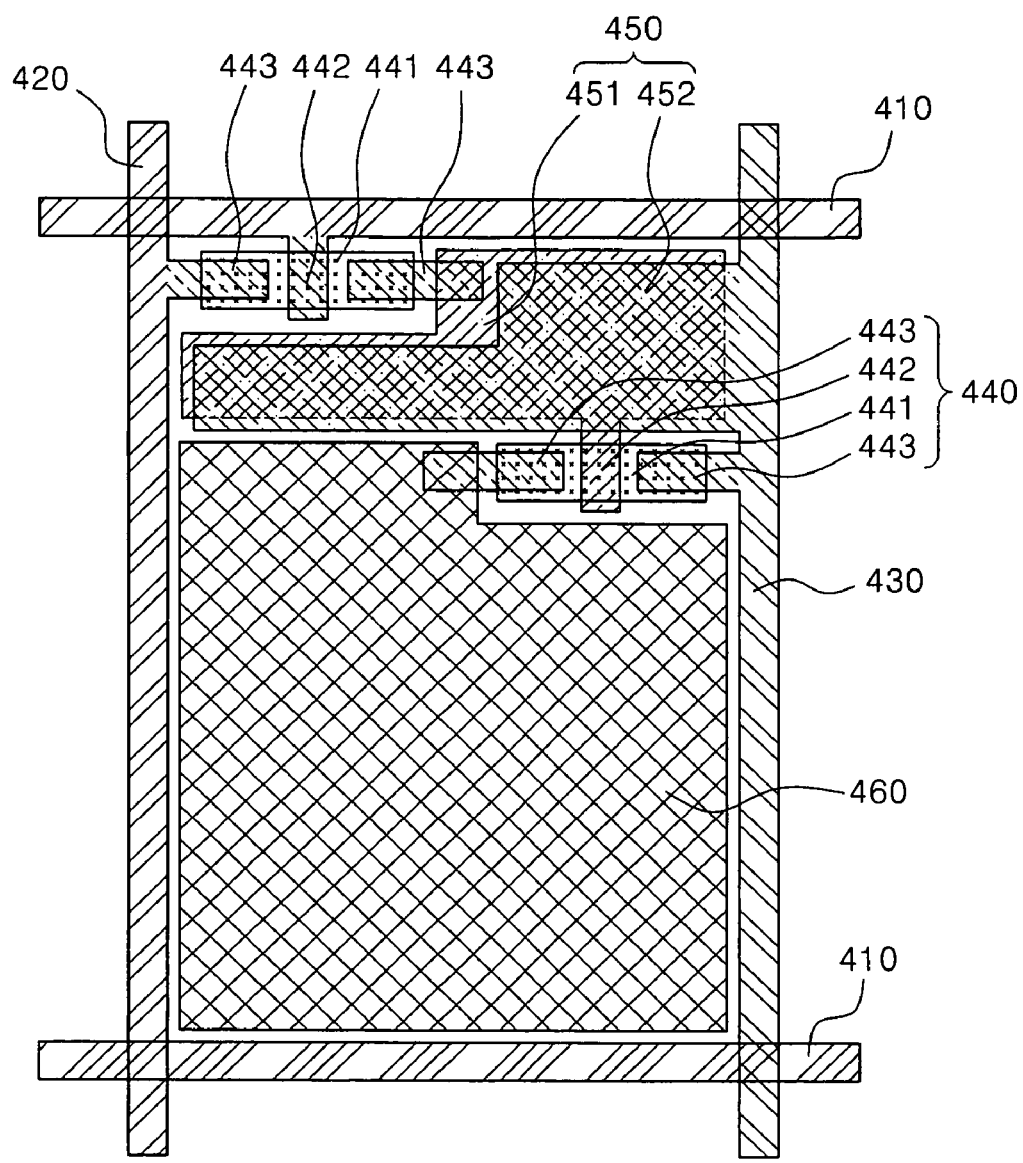
FIG. 5 is a plan view of an organic electro luminescent device including a crystallized semiconductor layer.
Figure 6A:
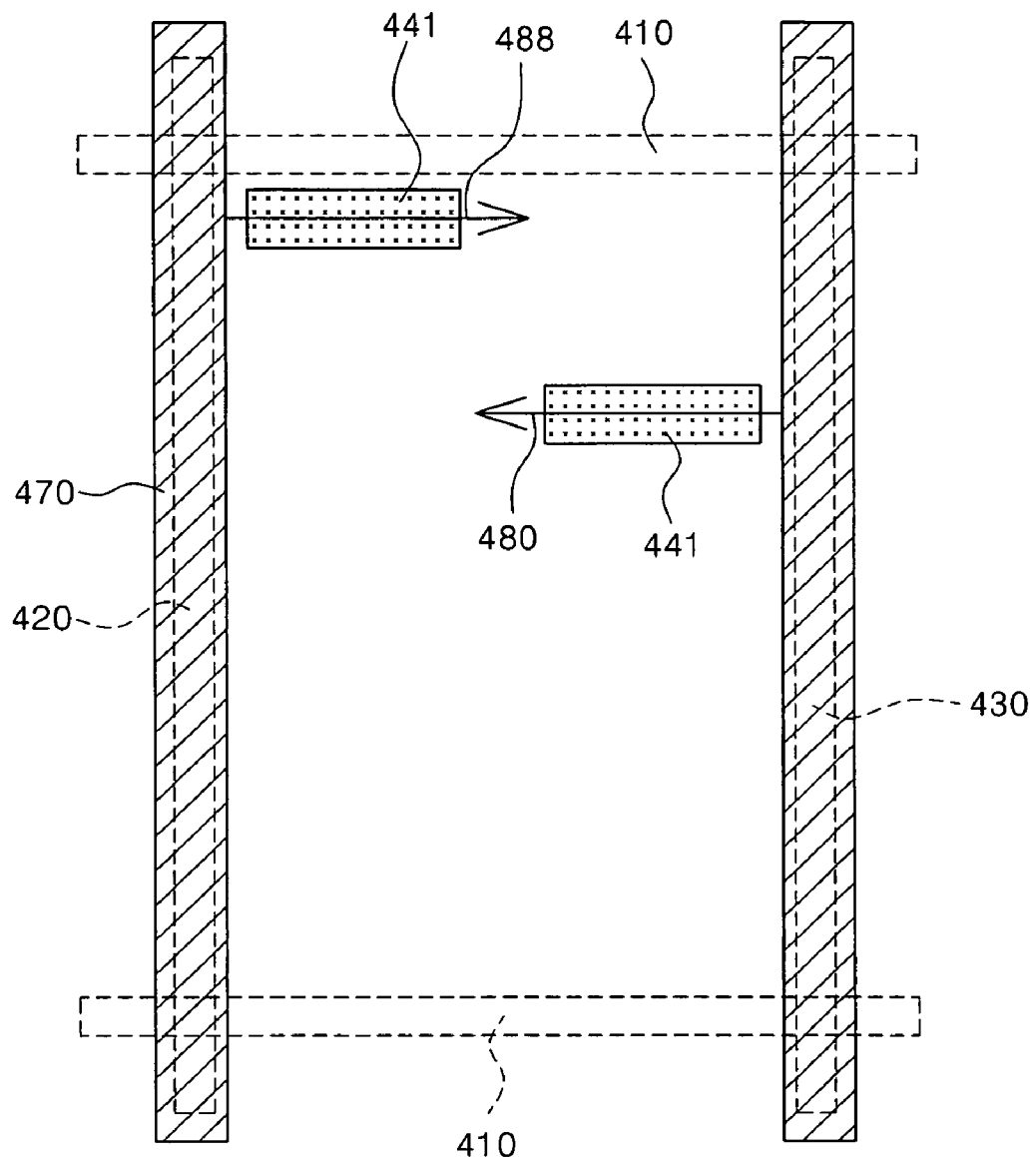
FIGS. 6A to 6C are examples showing crystallization of the semiconductor layer of FIG. 5.
Figure 6B:
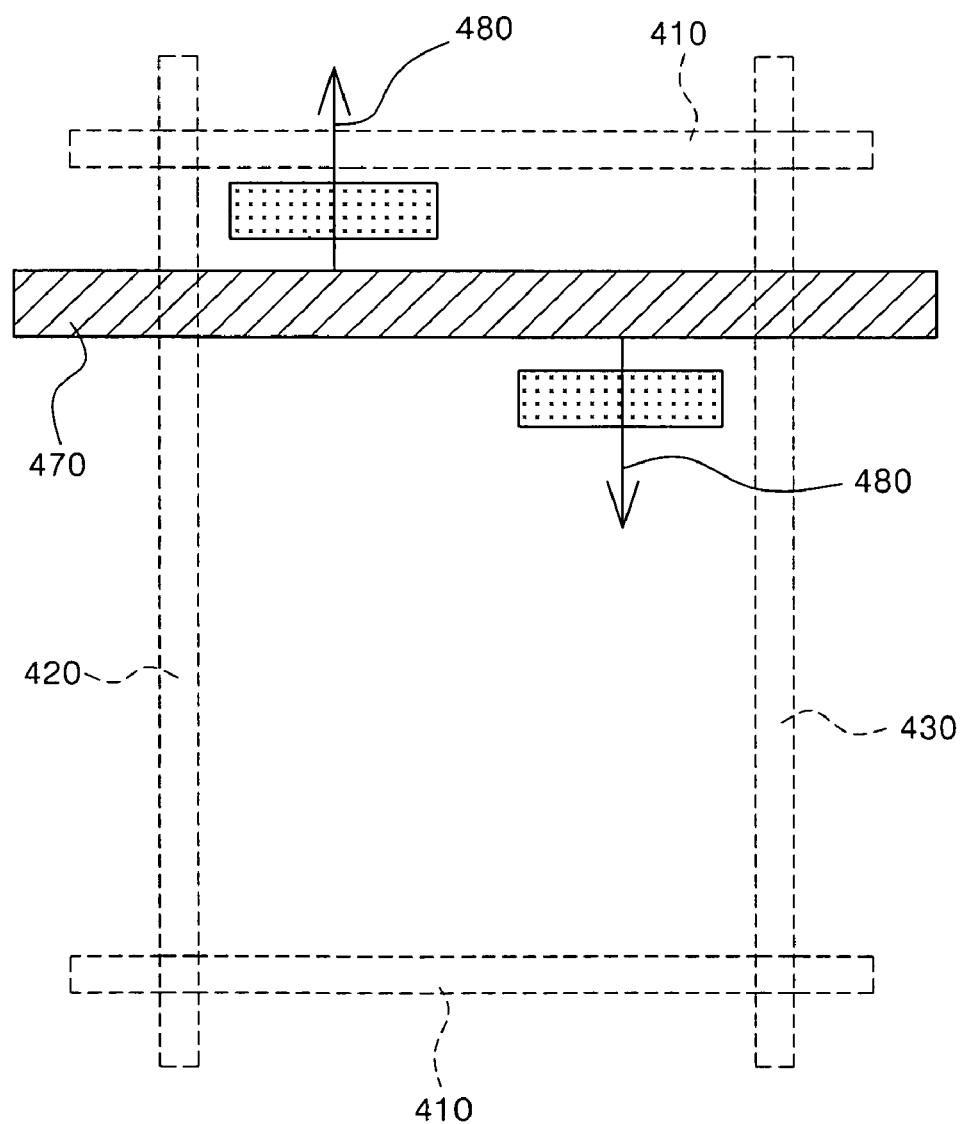
Figure 6C:
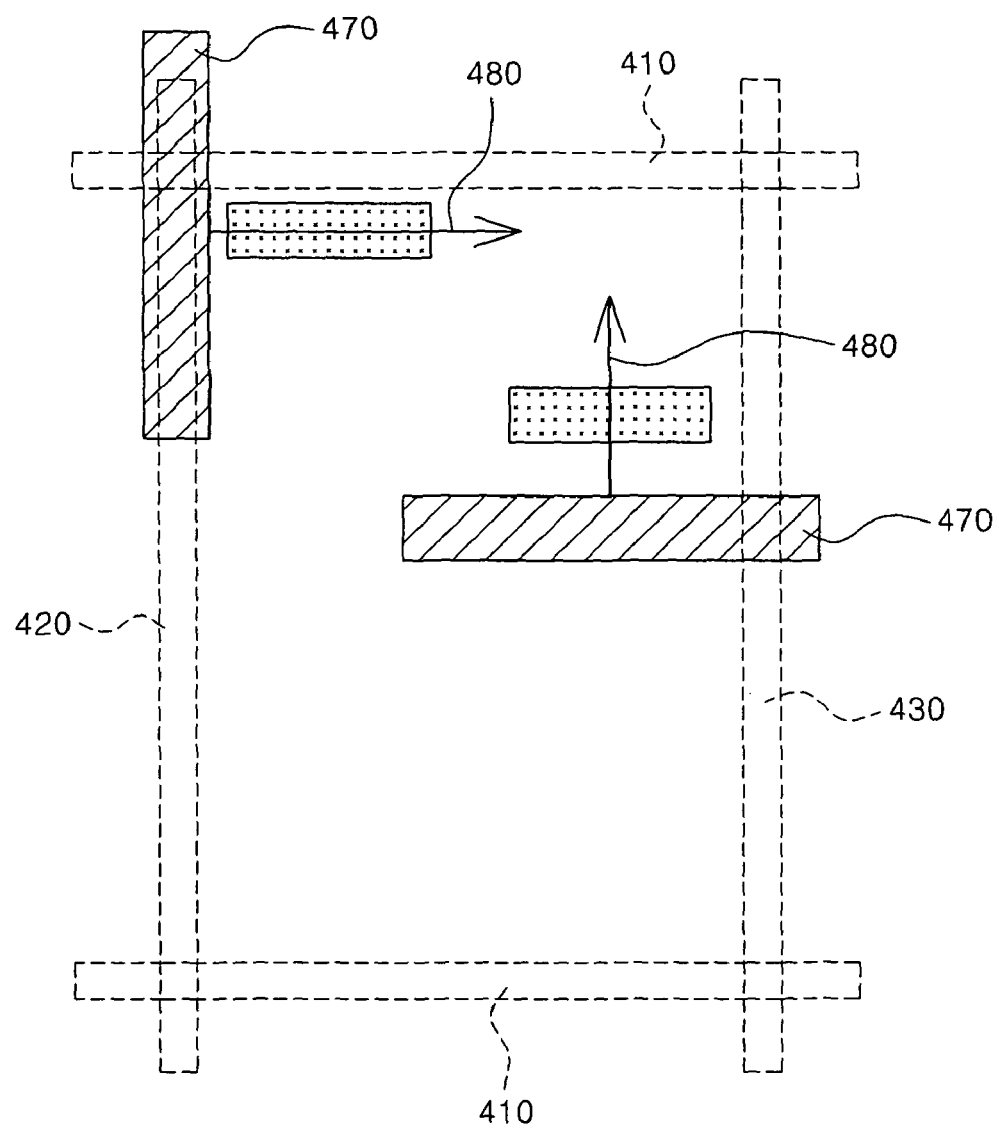

FIG. 5 is a plan view of an organic electroluminescent device including a crystallized semiconductor layer, and FIGS. 6A to 6C show exemplary embodiments of crystallizing the semiconductor layer in FIG. 5. Referring to FIG. 5, the device includes an unit pixel defined by scan line 410, data line 420, and common power line 430 disposed on a transparent insulating substrate such as glass or plastic. The unit pixel includes thin film transistor 440 having semiconductor layer 441, gate insulating layer (not shown) disposed on semiconductor layer 441, gate electrode 442 disposed on the gate insulating layer and corresponding to semiconductor layer 441, and source and drain electrodes 443 connected to predetermined regions of semiconductor layer 441, capacitor 450 including lower and upper electrodes 451 and 452, first electrode 460 connected to the source and drain electrodes of the thin film transistor, an organic film layer (not shown) disposed on first electrode 460 and including at least an organic emission layer, and a second electrode (not shown) disposed on the organic film layer.

An interlayer insulating layer (not shown) and/or a planarization layer is disposed on source and drain electrodes 443 to electrically protect and planarize thin film transistor 440. Thin film transistor 440 can be formed of a semiconductor layer formed by patterning a crystallization region crystallized using the technique shown in FIGS. 1A to 1F or 2A to 2F.

FIGS. 6A to 6C illustrate region 470 to be formed as the seed region and a growth direction of a crystallization region 480. A semiconductor layer is formed by forming an amorphous silicon layer on a substrate, by crystallizing the amorphous silicon layer with the technique described referring to FIGS. 1A to 1F or 2A to 2F, and by patterning the amorphous silicon layer. That is, FIG. 6A shows the crystallization of a semiconductor layer as follows. A region to be formed as a seed region is disposed in parallel with data line 420 or common power line 430, which will be formed in later processes. Crystallization region is formed by growing grains from the seed region, and then is patterned, thereby forming semiconductor region 441.

FIG. 6B shows the crystallization of a semiconductor layer in another configuration as follows. A region to be formed as a seed region is disposed parallel to scan line 410, which will be formed in later processes. A crystallization region is formed by growing grains perpendicularly to a longitudinal direction of the seed region, and then is patterned, thereby forming semiconductor region 441.

FIG. 6C illustrates another method of the crystallization of a semiconductor layer, which is performed the methods described referring to FIGS. 6A and 6B at the same time. A crystallization region is grown from a seed region formed parallel to data line 420 or common power line 430, and is patterned to form a semiconductor layer shown in the upper left corner of FIG. 6C. Another crystallization region is grown from a seed region formed parallel to scan line 410, and is patterned to form a semiconductor layer shown in the right side of FIG. 6C. Therefore, one semiconductor layer is obtained with the same method used to obtain the semiconductor layer shown in FIG. 6A, in which the grain boundaries are formed parallel to scan line 410. The direction parallel to scan line 410 is a traveling direction of electric charges, and the charges have a high traveling speed. Another semiconductor layer is obtained with the same method used to obtain the semiconductor layer shown in FIG. 6B, in which the grain boundaries are formed perpendicular to scan line 410. In this case, the grain boundaries are formed perpendicular to the traveling direction of electric charges. Therefore the traveling speed of the charges is low compared to the semiconductor layer formed in the method described referring to FIG. 6A, but has a high uniformity.

In the case of the semiconductor layer shown in FIG. 6C, it is possible to form the semiconductor layer to have required characteristics. That is, a semiconductor layer of a switching thin film transistor can be obtained, in which grain boundaries are disposed along a traveling direction of electric charges, and charges have a high traveling speed. Alternatively, another semiconductor layer of a driving thin film transistor can be obtained, in which grain boundaries are disposed perpendicular to the traveling direction of electric charges, and uniformity of another semiconductor layers is excellent.

Figure 7A:
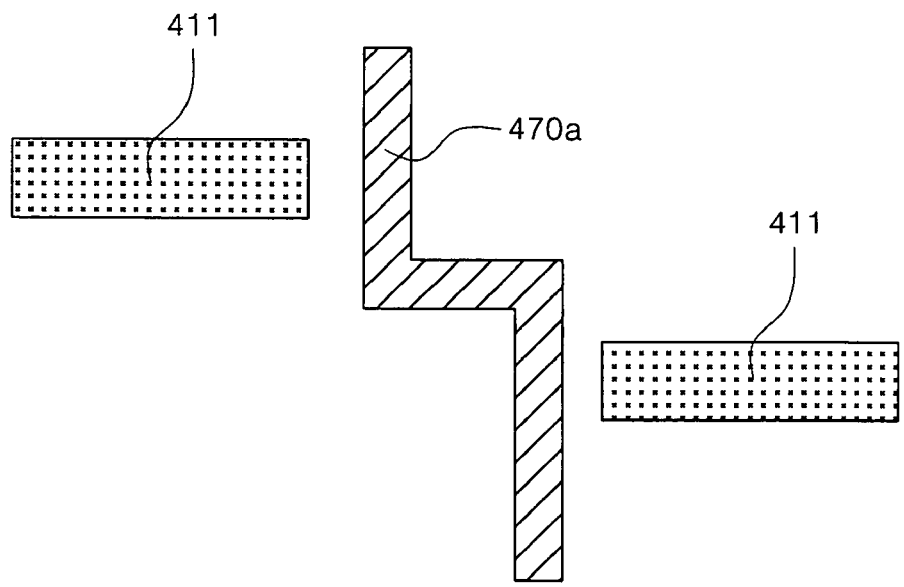
FIGS. 7A and 7B show shapes of a seed region.
Figure 7B:
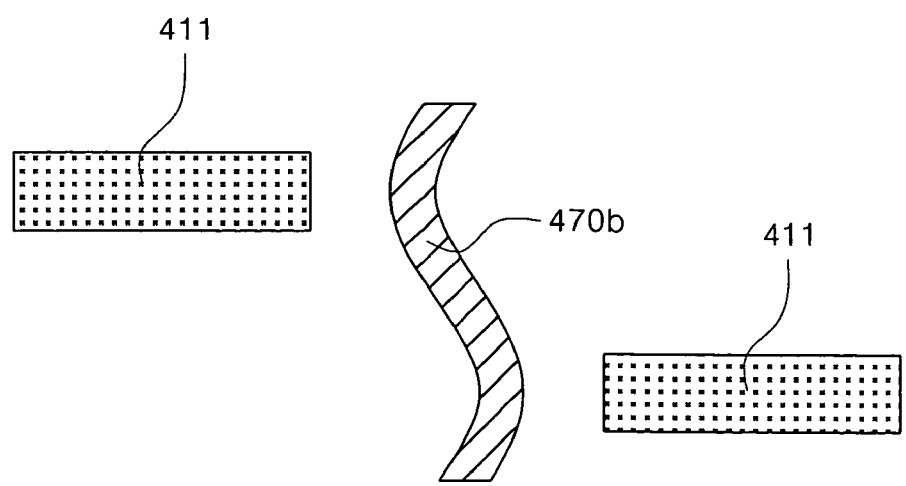

FIGS. 7A and 7B shows seed regions formed in different shapes than the shapes shown in FIGS. 6A to 6C. The seed regions illustrated in FIGS. 6A to 6C is formed in a line shape because it is easy to dispose first and second pattern layers. However, depending on the positions of the semiconductor layer or manufacture processes, the seed region can be formed into shapes of bent line 470a or curve 470b. As a result, the seed region applicable to the present invention can be formed in any shape but its smallest dimension is 3.5 µm.

Consequently, the polycrystalline silicon layer, a flat panel display made with the polycrystalline silicon layer, and a method of fabricating both according to the present invention enable fabrication of a thin film transistor and a flat panel display with excellent characteristics and uniformity. The predetermined region of the amorphous silicon layer is crystallized with the SGS crystallization technique. Regions other than the predetermined region are crystallized by spreading the crystallinity to the amorphous silicon layer. The semiconductor layer is formed by the grown amorphous silicon layer.

While exemplary embodiments of the present invention have been described herein, it will be apparent to those of ordinary skill in the art that various modifications in form and details can be made to the described embodiments without departing from the spirit and scope of the present invention as defined by the appended claims.

What is claimed is:

1. A polycrystalline silicon layer, comprising:
   a seed region formed on a surface of a substrate, the seed region having a width of 3.5 µm or more and including a plurality of polygonal grains; and
   a crystallization region grown by the seed region and formed on the surface of the substrate, wherein a major direction of grain boundaries of the crystallization region is substantially perpendicular to a longitudinal direction of the seed region, the major direction of the grain boundaries of the crystallization region being substantially parallel to the surface of the substrate, wherein a growth length of the crystallization region is about 20 µm or more, and a semiconductor layer of a thin film transistor is formed within the crystallization region, the seed region including at least one seed that includes at least one metal catalyst, the at least one metal catalyst having a concentration less than $1 \times 10^{13}$ atoms/cm$^2$.

2. The polycrystalline silicon layer according to claim 1, comprised of the seed region being crystallized by a super grain silicon (SGS) crystallization technique.

3. The polycrystalline silicon layer according to claim 1, comprised of the crystallization region being formed by spreading of crystallinity of the seed region.

4. The polycrystalline silicon layer according to claim 1, comprised of the seed region being formed in a line shape with a length that is longer than a width.

5. The polycrystalline silicon layer according to claim 1, comprised of the seed region having the width of 50 µm or less.

6. The polycrystalline silicon layer according to claim comprised of the seed region having at least one grain boundary.

7. A method of fabricating a polycrystalline silicon layer, comprising:
   forming an amorphous silicon layer on a surface of a substrate;
   forming a first pattern layer on the amorphous silicon layer, the first pattern layer having an opening through which a portion of the amorphous silicon layer is exposed;
   forming a second pattern layer on the first pattern layer and on the exposed portion of the amorphous silicon layer;
   forming a metal catalyst layer on the second pattern layer;
   crystallizing a region of the amorphous silicon layer to form a seed region in the amorphous silicon layer, the seed region having a width of at least 3.5 µm, the seed region being formed within the exposed portion of the amorphous silicon layer; and
   spreading crystallinity of the seed region beyond the exposed portion of the amorphous silicon layer to form a crystallization region, wherein a major direction of grain boundaries of the crystallization region is substantially perpendicular to a longitudinal direction of the seed region, the major direction of the grain boundaries of the crystallization region being substantially parallel to the surface of the substrate, wherein a growth length of the crystallization region is about 20 µm or more, and a semiconductor layer of a thin film transistor is formed within the crystallization region.

8. The method according to claim 7, wherein both of the step of crystallizing the region of the amorphous silicon layer and the step of spreading crystallinity of the seed region are performed by heat-treating the substrate.

9. The method according to claim 8, wherein the heat-treating the substrate is performed at a temperature of about 400° C. to 800° C. for a duration in the range of 1 minute to 3,000 minutes.

10. The method according to claim 7, wherein the first pattern layer includes a silicon oxide layer.

11. The method according to claim 10, wherein the silicon oxide layer has a thickness in the range of 50 Å to 5,000 Å.

12. The method according to claim 7, wherein the second pattern layer includes a silicon nitride layer.

13. The method according to claim 12, wherein the silicon nitride layer has a thickness in the range of 50 Å to 5000 Å.

14. The method according to claim 7, wherein the metal catalyst layer includes a metal catalyst in a concentration in a range of about $10^{11}$ atoms/cm$^2$ to $10^{15}$ atoms/cm$^2$.

15. A method of fabricating a polycrystalline silicon layer, comprising:
   forming an amorphous silicon layer on a substrate;
   forming a second pattern layer on the amorphous silicon layer;
   forming a first pattern layer on the second pattern layer, the first pattern layer having an opening through which a portion of a top surface of the second pattern layer is exposed;

forming a metal catalyst layer on the first pattern layer and on the exposed portion of the top surface of the second pattern layer;

crystallizing a region of the amorphous silicon layer to form a seed region in the amorphous silicon layer, the seed region having a width of at least 3.5 µm, the seed region being formed under the exposed portion of the second pattern layer; and spreading crystallinity of the seed region beyond the seed region of the amorphous silicon layer to form a crystallization region, wherein a major direction of grain boundaries of the crystallization region is substantially perpendicular to a longitudinal direction of the seed region, the major direction of the grain boundaries of the crystallization region, being substantially parallel to the surface of the substrate, wherein a growth length of the crystallization region is about 20 µm or more, and a semiconductor layer of a thin film transistor is formed within the crystallization region.

16. The method according to claim 15, wherein both of the step of crystallizing the region of the amorphous silicon layer and the step of spreading crystallinity of the seed region are performed by heat-treating the substrate.

17. The method according to claim 15, wherein the heat-treating the substrate is performed at a temperature of about 400° C. to 800° C. for a duration in the range of 1 minute to 3,000 minutes.

18. The method according to claim 15, wherein the first pattern layer includes a silicon oxide layer.

19. The method according to claim 15, wherein the silicon oxide layer has a thickness in the range of 50 Å to 5,000 Å.

20. The method according to claim 15, wherein the second pattern layer includes a silicon nitride layer.

21. The method according to claim 20, wherein the silicon nitride layer has a thickness in the range of 50 Å to 5000 Å.

22. The method according to claim 15, wherein the metal catalyst layer includes a metal catalyst in a concentration in a range of about $10^{11}$ atoms/cm$^2$ to $10^{15}$ atoms/cm$^2$.

23. A flat panel display, comprising:
a substrate;
a semiconductor layer formed on the substrate by patterning a crystallization region formed on the substrate;
a gate insulating layer disposed on the semiconductor layer;
a gate electrode disposed on the gate insulating layer;
an interlayer insulating layer disposed on the gate electrode;
a source electrode and a drain electrode disposed on the interlayer insulating layer and contacting the semiconductor layer;
a data line extending in a direction, the source electrode being connected to the data line; and
a seed region formed between the substrate and the data line, the seed region having a width of 3.5 µm or more and including a plurality of polygonal grains, wherein the crystallization region is grown from the seed region, a major direction of grain boundaries of the crystallization region being substantially perpendicular to a longitudinal direction of the seed region, the major direction of the grain boundaries of the crystallization region being substantially parallel to the substrate, wherein a growth length of the crystallization region is about 20 µm or more, and a semiconductor layer of a thin film transistor is formed within the crystallization region, the seed region including at least one metal catalyst, the at least one metal catalyst having a concentration less than $1\times10^{13}$ atoms/cm$^2$.

24. The flat panel display of claim 23, further comprising a scan line crossing the data line, the gate electrode being connected to the scan line.

25. The flat panel display of claim 24, wherein the scan line extends substantially perpendicular to the data line.

26. The flat panel display of claim 23, wherein the seed region is crystallized by a super grain silicon (SGS) crystallization technique.

27. The flat panel display of claim 23, wherein the seed region is formed in a line shape with a longer length than a width.

28. The flat panel display of claim 23, wherein the seed region has the width of 3.5 to 50 µm.

29. A flat panel display, comprising:
a substrate;
a semiconductor layer formed on the substrate by patterning a crystallization region formed on the substrate;
a gate insulating layer disposed on the semiconductor layer;
a gate electrode disposed on the gate insulating layer;
an interlayer insulating layer disposed on the gate electrode;
a source electrode and a drain electrode disposed on the interlayer insulating layer and contacting the semiconductor layer;
a data line extending in a direction, the source electrode being connected to the data line;
a scan line extending to cross the data line, the gate electrode being connected to the scan line; and
a seed region formed on a surface of the substrate and extending substantially parallel to the scan line, the seed region having a width of 3.5 µm or more and including a plurality of polygonal grains, wherein the crystallization is grown from the seed region, a major direction of grain boundaries of the crystallization region being substantially perpendicular to a longitudinal direction of the seed region, the major direction of the grain boundaries of the crystallization region being substantially parallel to the surface of the substrate, wherein a growth length of the crystallization region is about 20 µm or more, and a semiconductor layer of a thin film transistor is formed within the crystallization region, the seed region including at least one metal catalyst, the at least one metal catalyst having a concentration less than $1\times10^{13}$ atoms/cm$^2$.

30. The flat panel display of claim 29, wherein the scan line extends substantially perpendicular to the data line.

31. The flat panel display of claim 29, wherein the seed region is crystallized by a super grain silicon (SGS) crystallization technique.

32. The flat panel display of claim 29, wherein the seed region has the width of 3.5 to 50 µm.

* * * * *